| United States Patent [19] | [11] B 3,993,509 |
|---|---|
| McGinty | [45] Nov. 23, 1976 |

[54] SEMICONDUCTOR DEVICE MANUFACTURE

[75] Inventor: Gordon Kenneth McGinty, Norley, England

[73] Assignee: U.S. Philips Corporation, New York, N.Y.

[22] Filed: Oct. 29, 1974

[21] Appl. No.: 518,226

[44] Published under the second Trial Voluntary Protest Program on February 10, 1976 as document No. B 518,226.

[30] Foreign Application Priority Data
Nov. 7, 1973 United Kingdom............... 51619/73

[52] U.S. Cl.............................. 148/1.5; 250/492 A; 335/289; 357/91
[51] Int. Cl.²...................................... H01L 21/263
[58] Field of Search................. 148/1.5; 250/492 A; 335/289, 290; 357/91

[56] References Cited
UNITED STATES PATENTS

| 3,383,567 | 5/1968 | King et al. ....................... 148/1.5 X |
| 3,413,531 | 11/1968 | Leith................................ 148/1.5 X |
| 3,547,074 | 12/1970 | Hirschfeld........................ 148/1.5 X |
| 3,717,785 | 2/1973 | Guernet.......................... 250/492 A |
| 3,750,083 | 7/1973 | Fayling .............................. 335/290 |

*Primary Examiner*—L. Dewayne Rutledge
*Assistant Examiner*—J. M. Davis
*Attorney, Agent, or Firm*—Frank R. Trifari; Ronald L. Drumheller

[57] ABSTRACT

A semiconductor wafer is electrostatically clamped against a support by positioning an intermediate solid dielectric layer therebetween and applying a potential difference, thereby firmly and evenly clamping the wafer for photoresist or ion beam implantation operations.

10 Claims, 4 Drawing Figures

SEMICONDUCTOR DEVICE MANUFACTURE

This invention relates to methods of manufacturing a semiconductor device including clamping a semiconductor wafer against a support and effecting a processing step at the surface of the clamped wafer remote from the support. Such a processing step may involve directing radiation at the surface of the clamped wafer remote from the support. Such radiation may be for example a beam of ions for implantation, or radiation for exposure of a radiation-sensitive resist on the wafer. The invention further relates to ion-implantation machines.

In an ion-implantation machine used for semiconductor device manufacture, a semiconductor wafer is held in a target chamber in the path of an ion beam. The wafer holder generally comprises a metal support of, for example, aluminum or stainless steel, and having at least one support surface against which the semiconductor wafer is held. For low ion doses and small wafer sizes it is common practise to clamp the semiconductor wafer directly against the metal support by a mechanical clamping member bearing on the wafer surface remote from the support. In such circumstances heating of the wafer by the ion beam is generally not problematic. However, some forms of the clamping member are advantageous in that they shield part of the wafer surface from the ion beam.

Problems of heat dissipation and wafer distortion through heating do occur for high dose rates (for example an ion beam wattage of more than a few watts, implanted for several seconds) and for large wafer sizes (for example over 50 mm. in diameter for circular wafers). Mere mechanical clamping does not result in sufficient heat exchange across the whole back surface of the wafer to the support so that generally a heat-exchange fluid is smeared on the support before positioning the wafer. The wafer can then be held against the metal support by the intermediate heat-exchange fluid. Such a fluid may be for example a grease, an oil or a silver-rich paint. However, the use of such fluids can cause contamination problems of the semiconductor wafer surface and handling problems in afterwards dissolving away the fluid to remove the wafer from the support.

It should be noted that both when using mechanical clamping members and when using intermediate heat-exchange fluids it is common practice to connect a charge integrator to the metal support to measure the ion dose received by the wafer. Such a connection to the metal support relies on the existence of an adequate electrical current path between the wafer and the metal support.

Clamping of a semiconductor wafer can also be problematic for other processes used in semiconductor device manufacture. Thus, for example when exposing a radiation-sensitive resist (such as a photoresist or an electron-resist) on the front surface of the wafer, a mechanical clamping member may shield part of the surface against exposure. In addition, the wafer may become somewhat bowed resulting in a non-flat front surface, which can be exceedingly problematic if it is desired to selectively expose the resist layer by projecting an image pattern thereon.

According to a first aspect of the present invention, there is provided a method of manufacturing a semiconductor device including clamping a semiconductor wafer against a support and effecting a processing step at the surface of the clamped wafer remote from the support, in which method the wafer and support are electrically conductive at least adjacent their facing surfaces, a solid dielectric layer is present between the wafer and the support to prevent physical and electrical contact between these facing surfaces, and a potential difference is applied between the wafer and support to clamp the wafer against the support by the resulting electrostatic force across the dielectric layer.

Such an electrostatic clamping force set up by imposing a potential difference between the wafer and support can be readily controlled by controlling the potential difference and can be released instantly, thereby facilitating handling of the wafer. The wafer can be held evenly and firmly against the support, thereby obtaining good heat exchange for ion implantation, and flattening of the wafer can be obtained for image-projection exposure of radiation-sensitive resists. There is no need to use a clamping member which shields part of the wafer surface remote from the support, nor to use any heat-exchange fluid which contaminates the wafer and presents handling difficulties.

By appropriately choosing the dielectric constant and thickness of the dielectric layer and the potential difference, clamping pressures can be controlled up to at least $10^5$ Newtons/m². The relationship between the clamping force per unit area, and these other parameters can be represented by the formula $$P = \frac{\epsilon}{72\pi \times 10^9} \left(\frac{V}{t}\right)^2$$

where
 $P$ is the clamping pressure in Newtons/sq. meter,
 $V$ is the potential difference between the facing conductive surfaces in volts,
 $t$ is the thickness of the dielectric layer in meters, and
 $\epsilon$ is the dielectric constant of the dielectric layer.

Thus, by way of example, if $V = 100$ volts, $t = 10^{-5}$ m (10 microns), $\epsilon = 100$, the clamping force per square meter of surface is approximately $5 \times 10^4$ Newtons.

The dielectric layer may be provided on the back surface of the wafer; however this would necessitate an additional processing step for each wafer or batch of wafers. Therefore, preferably, the dielectric layer is on and adheres to the support.

According to a second aspect of the present invention there is provided an ion-implantation machine comprising a target chamber, means for directing an ion beam towards the target chamber, and a wafer holder for holding a semiconductor wafer in the target chamber in the path of the ion beam, which holder comprises a metal support having a solid dielectric layer on the wafer-supporting surface thereof, an electrical connection to the support, and an electrical connection on the support and insulated therefrom for contacting the edge of the wafer when provided on the dielectric layer, whereby a potential difference can be applied between these electrical connections for clamping the wafer against the support by the resulting electrostatic force across the dielectric layer. The advantages of having such a wafer holder in an implantation machine will be evident both from advantages described hereinbefore for methods in accordance with the first aspect of the invention and from the following specific description with reference to the accompanying drawings.

Embodiments of the various aspects of the invention will now be described with reference to these accompanying diagrammatic drawings, in which.

Figure 2:
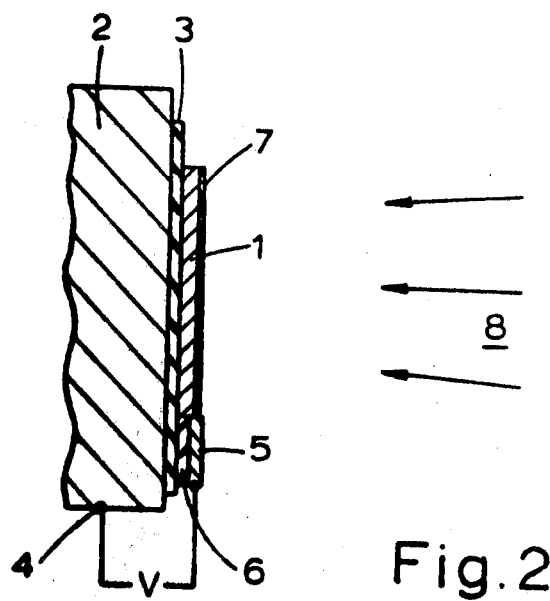
FIG. 2 is a cross-section of such a clamped wafer arrangement with radiation directed towards the wafer for exposing a radiation-sensitive resist on the wafer.
Figure 4:
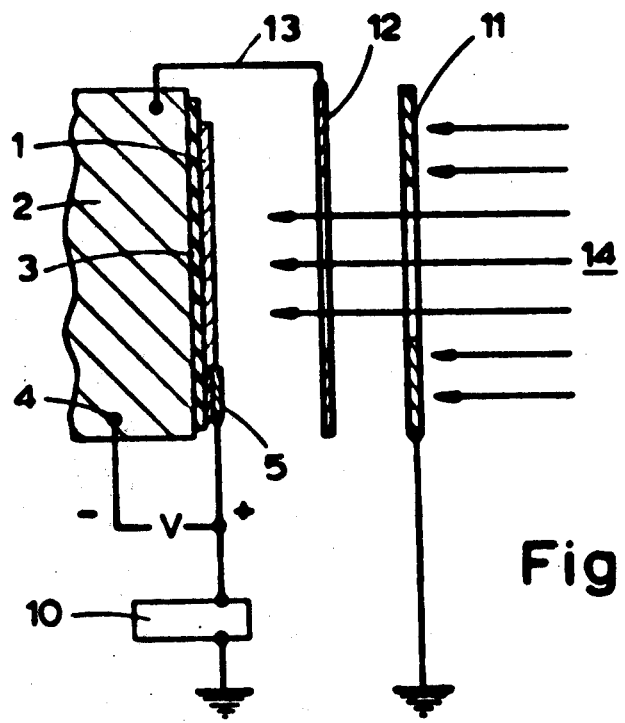
FIG. 4 is a cross-section of the arrangement shown in FIG. 3 with an ion beam bombarding the wafer.

The cross-sections of FIGS. 2 and 4 are so taken as to show the contact between the wafer and an electrical connection thereto.

Figure 1:
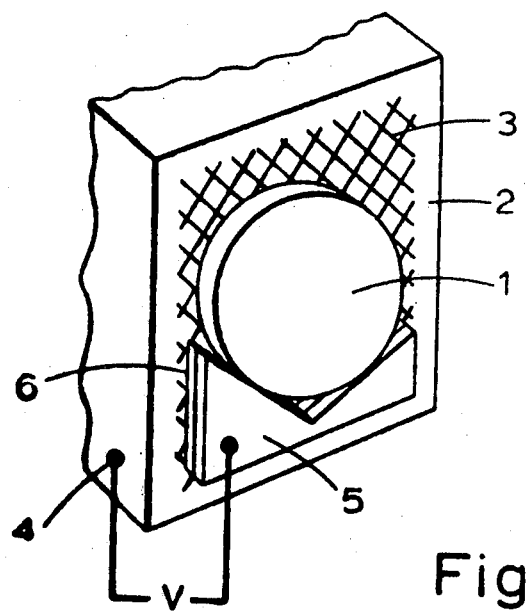
FIG. 1 is a perspective view of a semiconductor wafer clamped against a support for processing in the manufacture of a semiconductor device.

In the arrangement shown in FIG. 1, a semiconductor wafer 1 is clamped against a metal support 2 at a stage in the manufacture of a semiconductor device.

Semiconductor wafers used for semiconductor device manufacture generally comprise a bulk portion in the form of a silicon substrate of one conductivity type having a resistivity typically on the order of 10 ohm.cm., or less. Therefore such wafers are electrically conductive. Semiconductor device regions are formed locally in or on the front surface of the wafer 1. Thus, for example, insulated-gate field-effect transistors may be formed in the surface of the substrate, or bipolar transistors and/or diodes may be formed in a semiconductor epitaxial layer on the surface of the substrate. Generally, at least one insulating layer is also provided on the front surface of the wafer. The substrate is generally exposed at the back surface of the wafer. A typical thickness for the wafer 1 is approximately 0.25 mm.

In the arrangement shown in FIG. 1, a solid dielectric layer 3 is present on and adheres to the support surface of the support 2. The wafer 1 is located on the dielectric layer 3 so that the layer 3 prevents physical and electrical contact between the facing surfaces of the wafer 1 and the support 2, and the wafer 1 is electrically isolated from the metal support 2.

Two electrical connections 4 and 5 are present on the metal support 2. The connection 4 is a connection to the support 2. The connection 5 is mounted on the support 2 but is electrically insulated therefrom. When the wafer 1 is located on the dielectric layer 3, the connection 5 contacts the wafer 1 and thus makes electrical connection thereto.

The wafer 1 located on the dielectric layer 3 is clamped by applying a potential difference V between the connections 4 and 5. This potential difference sets up an electrostatic clamping force across the dielectric layer 3, the magnitude of which depends, as discussed hereinbefore, on both the dielectric constant and thickness of the layer 3 and the potential difference V. The wafer 1 is sufficiently conductive that the potential applied to the wafer is maintained across the surface area of the wafer so that the wafer 1 is held against the support 2 with a substantially uniform force over all the facing area.

The material of the dielectric layer 3 is chosen to have a sufficiently high dielectric constant $\epsilon$, and a sufficiently high dielectric strength $(V/t)_{max}$ to withstand the highest potential difference it is desired to apply.

Depending on the required force, many dielectric materials are possible, for example glasses and ceramics. Particularly advantageous dielectric materials are those such as barium titanate which have dielectric constants as high as 1,000 or even higher. In addition, where good heat transfer from the wafer 1 to the support 2 is desired (see hereinafter with reference to FIGS. 3 and 4) the dielectric layer 3 should have adequate thermal conductivity and a small thickness, for example a few microns. For a layer 3 having a small thickness a material of high dielectric strength is necessary to permit a high electrostatic clamping force.

One particular advantageous way of locating the wafer 1 on the layer 3 and making electrical connection to the wafer 1 is shown by way of example in FIG. 1. The electrical connection 5 comprises a metal plate having a V-shaped recess therein in which the wafer 1 is located. The recess edges of the plate adjoin the edge of the wafer 1 to make the electrical connection thereto. Thus, no member associated with the clamping overlies and shields the front surface of the wafer 1. The connection plate 5 may be mounted on an insulator 6. However, in some cases, the insulator 6 may be omitted and the connection plate 5 may be insulated from the metal support 1 by the dielectric layer 3.

With the wafer 1 thus clamped, its surface remote from the support 2 is subjected to a processing step.

FIG. 2 illustrates a stage in a method of manufacturing a semiconductor device in which a radiation-sensitive resist layer 7 on the front surface of the clamped wafer 1 is selectively exposed to radiation 8.

The resist layer 7 may be of the ultra-violet photosensitive type or the electron-sensitive type. It is provided on the front surface of the wafer 1 in a conventional manner before locating and clamping the wafer 1 on the support 2. The resist may be present on an insulating layer on the semiconductor surface of the wafer 1, and after selective exposure and development, the remaining portions of the resist layer may be used as an etchant mask when opening windows in the insulating layer in a conventional manner. However the resist may be such as forms on exposure on insulating layer material on the wafer surface.

The wafer-supporting surface of the metal support 2 and dielectric layer 3 is optically flat, and the wafer 1 is flattened against this supporting surface by clamping as described with reference to FIG. 1.

The radiation 8 is then focussed onto the flat front surface of the photoresist layer 7 in an image pattern corresponding to the desired exposure pattern. After exposure, the potential difference V is switched off and the wafer 1 is released from the support 2 and is subsequently processed in a conventional manner.

Figure 3:
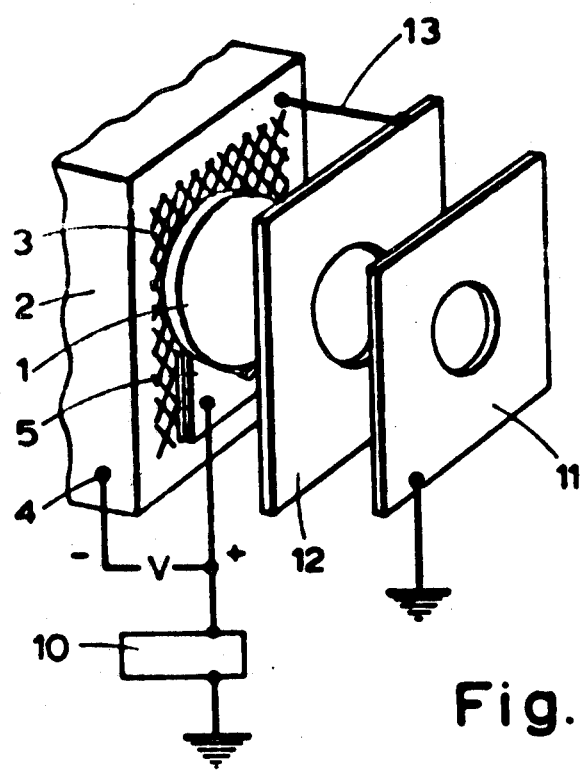
FIG. 3 is a perspective view of various electrodes and a wafer clamped against a wafer holder within a target chamber of an ion implantation machine.

FIGS. 3 and 4 illustrate stages in the manufacture of a semiconductor device in which a semiconductor wafer 1 is clamped against a support surface of a wafer holder 2 of an ion implantation machine. The clamping arrangement is basically the same as that described with reference to FIG. 1. Thus, the wafer 1 is separated from the supporting surface of the wafer holder 2 by a thin dielectric layer 3, and is clamped by applying a potential difference V between connections 4 and 5.

A charge integrator 10 is present for measuring the ion dose received by the wafer 1. In a conventional ion implantation machine, the charge integrator is connected to the wafer holder 2. However, this is not possible for the clamping arrangement shown in FIGS. 3 and 4, as there is no direct electrical connection between the wafer 1 and the wafer holder 2. As shown in FIGS. 3 and 4, the charge integrator 10 is directly connected to the wafer 1 via the same electrical connection 5 as is used to apply the potential difference V to the wafer 1.

Two electrodes 11 and 12 are present in the target chamber of the ion implantation machine. Electrode 11 is earthed and serves to define the cross-sectional area through which the ion beam is allowed to pass. Electrode 12 is maintained at a negative potential relative to the wafer 1 and serves to suppress secondary emission of negative particles, principally electrons, from the ion-bombarded wafer. Generally, it is suitable to apply a negative potential of approximately 90 or 100 volts to the electrode 12. This can readily be achieved if a direct electrical connection 13 exists between the wafer holder 2 and the suppressor electrode 12 whereby the same potential difference applied across the dielectric layer 3 to clamp the wafer 1 is maintained between the wafer 1 and the suppressor electrode 12. However, if the potential difference desired for the clamping force results in inadequate suppression of secondary emission, a magnetic field may also be applied between the wafer holder 2 and electrode 12 and transverse to the direction of the ion beam.

After clamping the wafer 1 against the wafer holder 2, an ion beam 14 is directed at the front surface of the wafer 1. From an ion source the ion beam 14 is produced and accelerated towards the clamped wafer 1 in the target chamber by electrostatic and magnetic fields generated and used in a conventional manner. Generally, such a beam consists of donor or acceptor impurity ions which are to be implanted in the semiconductor adjacent the top surface of the wafer 1. Such ions implanted in the semiconductor may be implanted through, for example, a thin insulating and passivating layer on the top wafer surface. In addition implantation masking layers, for example of metal may be used on the top wafer surface. However, instead of implanting the ions 14 in the semiconductor, they may be implanted in a thin layer on the top surface of the wafer 1. Furthermore the ions 14 may be of, for example, a neutral impurity such as neon.

When the semiconductor wafer 1 has a large cross-sectional area and the ion beam 14 has a wattage of more than a few watts and is implanted for several seconds, good heat exchange is desirable across the whole of the back surface of the wafer 1 to the metal wafer holder 2. This can be achieved by making the dielectric layer 3 of adequate thermo-conductivity and small thickness (for example a few microns). A material of appropriately high dielectric strength must then be chosen to stand the potential difference V applied across this small thickness. Preferably a high dielectric constant material like barium titanate should be chosen. By using a high enough potential difference V for the particular wafer 1 to be clamped, the wafer 1 can be firmly and evenly clamped against the holder 2 across the whole of the back surface of the wafer so as to improve the heat exchange.

Many modifications are possible within the scope of the invention defined in the appended Claims. Thus, for example, in an ion implantation machine, the potential difference V used for clamping the wafer 1 need not also be used for suppression of secondary emission from the wafer. Thus, for example, the direct connection 13 may be omitted, and a separate potential difference for suppression may be applied between wafer connection 5 and the suppression electrode 12. In another form, the connection 13 is omitted and the suppression electrode 12 is directly connected to the wafer connection 5 to form a Faraday cage-type arrangement over the wafer 1.

What I claim is:

1. A method of holding a semiconductor wafer against a support while effecting a processing step at the surface of the wafer remote from the support, comprising the steps of:
    positioning a solid dielectric layer between facing surfaces of a support and a semiconductor wafer, said support and wafer being conductive, at least adjacent to said facing surfaces thereof, said dielectric layer preventing physical and electrical contact between said facing surfaces; and
    applying a potential difference between said facing surfaces, thereby clamping said wafer against said support by electrostatic force across said dielectric layer.

2. A method as defined in claim 1 wherein said dielectric layer adheres to said support.

3. A method as defined in claim 1 wherein electrical contact is made to an edge of said semiconductor wafer for applying an electric potential thereto.

4. A method as defined in claim 1 and further comprising the step of directing radiation toward the surface of the wafer remote from said support to selectively expose a radiation-sensitive resist layer on said remote surface.

5. A method as defined in claim 4 wherein said resist layer is selectively exposed by projecting an image pattern of radiation onto said resist layer.

6. A method as defined in claim 1 and further comprising the step of directing a beam of ions toward the surface of the wafer remote from the support for implantation thereof onto said remote surface.

7. A method as defined in claim 6 and further comprising the step of positioning a suppressor electrode in front of said remote surface to suppress secondary emission from said remote surface.

8. A method as defined in claim 7 and further comprising the step of electrically connecting said suppressor electrode to said support, so that said applied potential difference is also applied between said wafer and said suppressor electrode.

9. A method as defined in claim 6 and further comprising the step of connecting a charge-integrator to said wafer for measuring the ion dose received by said wafer.

10. Apparatus for holding a semiconductor wafer for processing, comprising:
    support means having a flat electrically conductive support surface;
    a solid dielectric layer covering at least a region of said support surface for maintaining a semiconductor wafer surface in close facing relationship with said support surface without physical or electrical contact therebetween;
    first electrical connection means mounted on said support means and electrically insulated therefrom for electrically contacting the edge of a semiconductor wafer positioned on said dielectric layer; and
    second electrical connection means in electrical contact with said support surface, whereby an electrical potential difference may be applied between said first and second electrical connection means to hold a semiconductor wafer against said dielectric layer by electrostatic force across said dielectric layer.

* * * * *